(12) United States Patent
Wells et al.

(10) Patent No.: US 6,372,404 B1
(45) Date of Patent: Apr. 16, 2002

(54) METHOD, ARTICLE AND COMPOSITION FOR LIMITING PARTICLE AGGREGATION IN A MASK DEPOSITED BY A COLLOIDAL SUSPENSION

(75) Inventors: David H. Wells; James J. Hofmann, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/650,473

(22) Filed: Aug. 29, 2000

Related U.S. Application Data

(62) Division of application No. 09/251,766, filed on Feb. 17, 1999.

(51) Int. Cl.[7] ............................................. G03C 1/76
(52) U.S. Cl. ........................................ 430/270.1; 430/5
(58) Field of Search ....................... 430/5, 270.1, 271.1

(56) References Cited

U.S. PATENT DOCUMENTS

| | | | | |
|---|---|---|---|---|
| 4,407,695 A | | 10/1983 | Deckman et al. ............ | 156/643 |
| 4,465,551 A | | 8/1984 | Horwitz ....................... | 156/643 |
| 4,522,910 A | * | 6/1985 | Hallman ...................... | 430/157 |
| 5,399,238 A | | 3/1995 | Kumar ......................... | 156/643 |
| 5,676,853 A | * | 10/1997 | Alwan .......................... | 216/11 |
| 5,700,627 A | | 12/1997 | Ida et al. ..................... | 430/311 |
| 5,702,281 A | | 12/1997 | Huang et al. ................. | 445/50 |
| 5,727,977 A | | 3/1998 | Maracas et al. .............. | 445/24 |
| 5,861,707 A | | 1/1999 | Kumar ......................... | 313/309 |
| 5,871,870 A | * | 2/1999 | Alwan .......................... | 430/5 |
| 6,037,104 A | | 3/2000 | Lahaug ........................ | 430/314 |
| 6,228,538 B1 | * | 5/2001 | Michiels et al. ............... | 430/5 |

OTHER PUBLICATIONS

Bowden et al., "Self–Assembly of Mesoscale Objects into Ordered Two–Dimensional Arrays," *Science* 276:233–235, 1997.

* cited by examiner

*Primary Examiner*—Mark F. Huff
*Assistant Examiner*—Saleha R. Mohamedulla
(74) *Attorney, Agent, or Firm*—Dorsey & Whitney LLP

(57) ABSTRACT

A method, composition, and article for patterning and depositioning a substrate employing a colloidal suspension includes the step of agitating the colloidal suspension to eliminate aggregations of colloidal particles in the substrate The colloidal suspension may include a plurality of colloidal particles in a suspension medium which may comprise deionized water, a resist such as photoresist, and a solvent.

3 Claims, 4 Drawing Sheets

METHOD, ARTICLE AND COMPOSITION FOR LIMITING PARTICLE AGGREGATION IN A MASK DEPOSITED BY A COLLOIDAL SUSPENSION

CROSS-REFERENCE TO RELATED APPLICATION

This application is a divisional of U.S. patent application Ser. No. 09/251,766, filed Feb. 17, 1999 allowed.

STATEMENT OF GOVERNMENT INTEREST

This invention was made with United States Government support under contract No. DABT63-97-C-0001 awarded by the Advanced Research Projects Agency (ARPA). The United States Government has certain rights in this invention.

TECHNICAL FIELD

This invention relates to the field of microstructure fabrication, and more particularly, to processes and compositions, for patterning and depositioning microelectronic substrates.

BACKGROUND OF THE INVENTION

The present invention relates to masks used for etching of and deposition an substrate surfaces. Microfabrication techniques for making patterns in a surface of a material may be employed in many areas. These techniques are particularly important in the electronics industry which employs microelectronic devices having ever decreasing component size. Microfabrication techniques typically employ fine line lithography to transfer patterns into a resist to form a mask. The patterns are then transferred to the surface of the substrate by etching.

It is also known to use a monolayer film of colloidal particles as a mask in the patterning process. The colloidal particles are formed as polymeric spheres. The mask is formed by coating a substrate with a monolayer of colloidal particles such that the particles are fixed to the substrate. The colloidal particles may be arranged on the surface in either a random or ordered array. Contacting the colloidal suspension with the substrate and rotating the substrate in a horizontal plane about an axis normal to the surface of the substrate at a sufficient speed yields a densely packed ordered monolayer of colloidal particles. The degree of order in the arrays is dependent upon the particle size, the degree of attraction to the substrate and the velocity of the flow along the substrate, surface, Adjusting the surface chemistry of the substrate ensures that the colloidal suspension wets the substrate.

The array of particles serves a lithographic mask, a suitable etching process transferring the random or ordered array to the substrate. The lithographic mask may also serve as a deposition mask. The current techniques rely on the electrostatic attraction between a surface charge on the colloidal particles and a surface charge on the substrate that is different from the surface charge on the colloidal particles.

The use of colloidal particle layer to form a mask is particularly suited for forming field emission tips in a microelectronic substrate. Field emitters are widely used in microscopes, flat panel displays and vacuum microelectronic applications, Cold cathode or field emission based flat panel displays have several advantages over other types of flat panel displays, including low power dissipation, high intensity and low projected cost. In field emission or cold emission displays, a strong electric field liberates electrons from a substance, usually a metal or semiconductor, into a dielectric, usually a vacuum, Field emitters have been extensively studied and are well known in the art.

The shape of a field emitter strongly affects its emission characteristics, sharply pointed needles or ends having a smooth, nearly hemispherical shape being the most efficient shapes. The limitations of lithographic equipment has made it difficult to build high performance, large field emitters with more than a few emitter tips per square micron. It is also difficult to perform fine feature photolithography on large area substrates as required by flat panel display type applications. Hence, previous attempts have been made to use colloidal particle masks to fashion field emitter tips in microelectronic substrates. Those attempts have not been very successful due to the tendency of the colloidal particles to aggregate in groups, leading to an undesired distribution of field emitter tips in the microelectronic substrate.

SUMMARY OF THE INVENTION

The present invention overcomes the limitations of the prior art by providing a colloidal suspension containing a plurality of particles in a medium, applying the colloidal suspension to a surface of a substrate such as a microelectronic substrate, and agitating the colloidal suspension to break up any aggregation of particles. In an exemplary embodiment, the colloidal suspension comprises a plurality of polymeric spheres, e.g., polystyrene, polydivinyl Benzene, and polyvinyl toluene, in a suspension medium which comprises deionized water, a resist such as a photoresist, and a solvent such as isopropyl alcohol. The solvent is removed from the suspension medium, such as through evaporative processes, leaving behind a layer of colloidal particles. The particles are well dispersed across the surface of the substrate, the agitation eliminating any aggregations or clumps. The layer of particles serves as a mask for etching or depositioning the substrate. Etching may be performed through conventional chemical means, or through other means such as reactive plasma or ion beam etching-Likewise, depositioning may be performed by conventional depositioning means.

Applying a mechanical vibration to the colloidal suspension is one method suitable for breaking up aggregations of colloidal particles. Applying ultrasonic or megasonic acoustic energy are also suitable methods for breaking up any aggregations.

Further control over the colloidal particles may be realized by establishing a potential energy gradient across the substrate, Such can be realized by application of a charge to the plurality of particles and the substrate, or through the application of a heat gradient or gravitational gradient across the substrate.

The method and composition are suitable for forming micron and submicron structures on a substrate, for example, the forming of field emitter tips in a microelectronic substrate. The method does not rely on the use of electrostatic attraction for causing the particles to adhere to the substrate at the point where they strike the surface. In fact, the process relies on the agitation of the colloidal particles after they have been applied to the substrate to break up any aggregations of the particles, The method achieves a better dispersion of microelectronic components, such as field emitter tips, over the surface of the substrate resulting in a device having better performance characteristics.

DETAILED DESCRIPTION OF THE INVENTION

Figure 1:
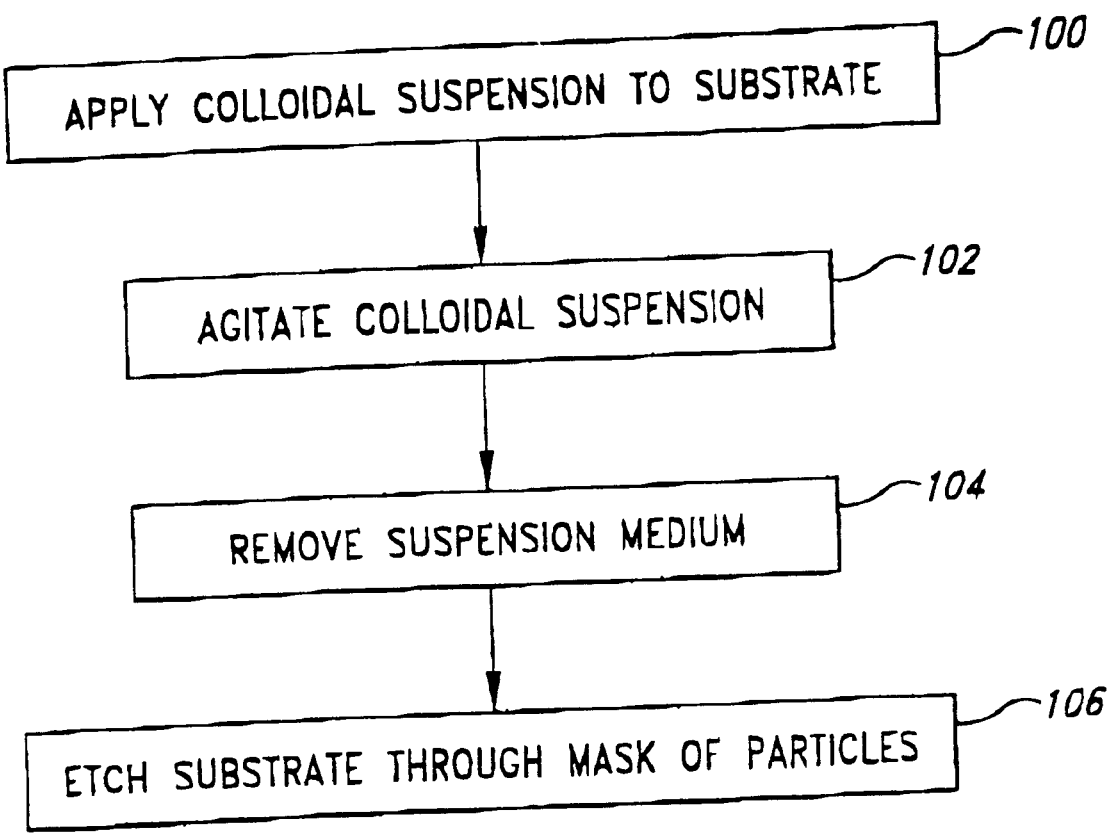
FIG. 1 is a flow chart stowing the steps according to one exemplary method of the invention.

Referring first to FIG. 1, a first exemplary method of carrying out the invention is shown. The first step 100, comprises applying a colloidal suspension 10 to a substrate 12, such as a microelectronic substrate.

Figure 2:
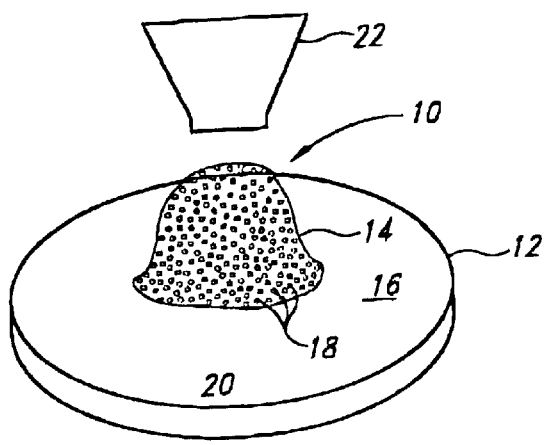
FIG. 2 is a isometric view of a colloidal suspension being applied to a substrate according to a first exemplary embodiment of the applying step of FIG. 1.
Figure 3:
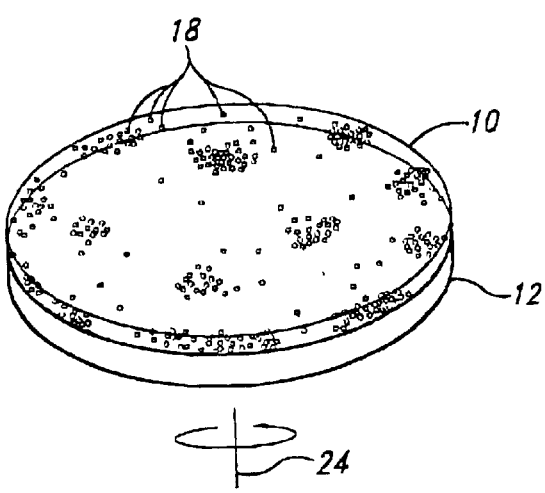
FIG. 3 is a isometric view of the colloidal suspension of FIG. 2 being dispersed across the surface of the substrate by spinning, according to the first exemplary embodiment of the applying step of FIG. 1.

A first exemplary method of applying the colloidal suspension 10 to the substrate 12 in accordance with step 100 is shown in FIGS. 2 and 3. With reference to FIG. 2, the first exemplary method includes depositing a glob 14 of the colloidal suspension 10 substantially at the center of a surface 16 of the substrate 12. The colloidal suspension 10 comprises a plurality of colloidal particles 18 suspended in a suspension medium 20. A conventional device 22 may deposit the colloidal suspension 10 on the surface 16.

With reference to FIG. 3, one method of distributing the colloidal suspension 10 across the surface 16 of the substrate 12 is by rotating or spinning the substrate about a longitudinal axis 24. The rotational velocity of the substrate 12 is important to achieving proper dispersion of the colloidal suspension 10 across the surface 16 of the substrate 12. While spinning the substrate 12 causes the colloidal suspension 10 to disperse across the surface 16, it fails to break up any aggregations or clumps of the colloidal particles 18. Etching of the substrate 12 through the resulting mask will produce a plurality of field emitter tips, many of which will be clumped together.

Figure 4:
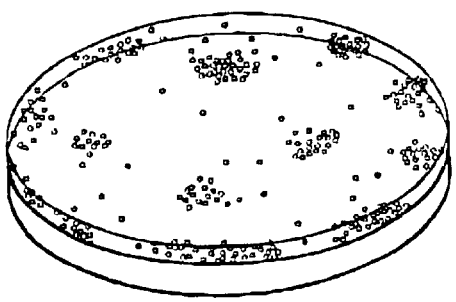
FIG. 4 is a isometric view showing the application of a colloidal suspension to a substrate according to a second exemplary embodiment of the applying step of FIG. 1.

An second exemplary method of applying the colloidal suspension 10 to the surface 16 of substrate 12, in accordance with step 100 (FIG. 1) is shown in FIG. 4. In this case, the colloidal suspension 10 is sprayed over the surface 16, substantially covering the entire surface 16. Thus, the spinning or rotating of the substrate 12 about the longitudinal axis 24 may be eliminated.

Figure 5:
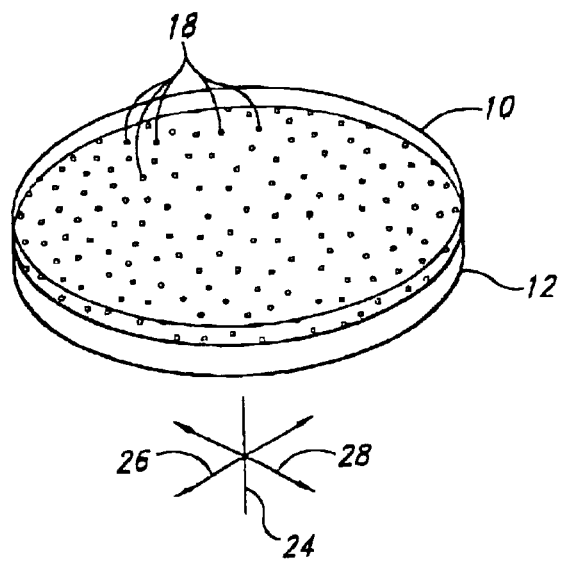
FIG. 5 is a isometric view of the colloidal suspension covering the substrate after an agitation step.

After the application of the colloidal suspension 10 to the substrate 12, the colloidal suspension 10 is agitated as in accordance with step 102 (FIG. 1). There are a variety of methods for agitating the colloidal suspension such that any aggregation of particles is broken up. For example, with reference to FIG. 5, applying a mechanical vibration directly to the colloidal suspension 10 or indirectly to the colloidal suspension 10 through the substrate 12 can sufficiently agitate the colloidal suspension 10 The mechanical vibration may be along axes 26, 28 which are perpendicular to the longitudinal axis 24. The vibration should be of sufficient intensity, duration and period to effectively break up any aggregation of colloidal particles 18 in the suspension medium 20. Applying ultrasonic or megasonic acoustic energy, having frequencies greater than approximately 16 kHz will also agitate the colloidal suspension 10 sufficiently to raise the effective temperature of the particles to break apart any aggregation of colloidal particles 18 therein. The mechanical or acoustical energy may be of a period and amplitude sufficiently large to set up a standing wave in the colloidal suspension 10.

Further control over the colloidal particles 18 may be realized by establishing a potential energy gradient across the substrate 12. Such can be realized by application of a charge to the plurality of colloidal particles 18 and the substrate 12, or through the application of a heat to the substrate 12 to establish a temperature gradient thereacross or, by establishing a gravitational gradient across the substrate 12 by, for example, tilting the substrate 12 with respect to a gravitational vector.

In the exemplary embodiment, the colloidal suspension 10 comprises of a plurality of colloidal particles 18 suspended in a suspension medium 20. The colloidal particles 18 may take the form of beads or spheres of a polymer, such as polystyrene, polydivinyl Benzene, or polyvinyl toluene. The spheres are often made by either suspension or emulsion polymerization. The spheres can be conveniently fabricated in sizes ranging from 0.5 to 5 microns. Suitable sphores are available from Interfacial Dynamics Corporation of Portland, Oreg. and Bangs Laboratories, Incorporated of Fishers, Ind. The suspension medium 20 comprises deionized water, photoresist and a solvent, in the exemplary embodiment. For example, a suitable mixture may comprise: one milliliter of particles in deionized (DI) water combined with 20 milliliters of a photoresist and 5 milliliters of a solvent, such as isopropyl alcohol. The preferred range of for the mixture is approximately 2–20 milliliters of photoresist and approximately 5–50 milliliters of solvent per litter of particles in DI water.

Figure 6:
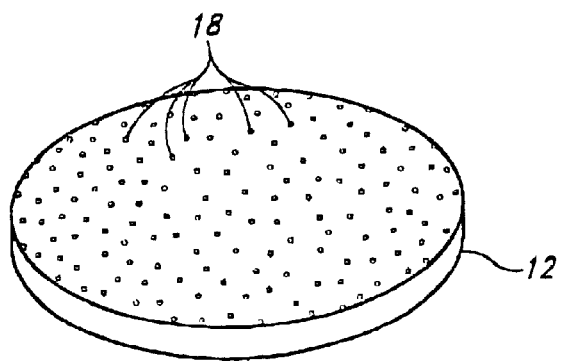
FIG. 6 is a isometric view of the colloidal mask layer formed on the substrate after the removal of the solvent from the colloidal suspension.
Figure 7:
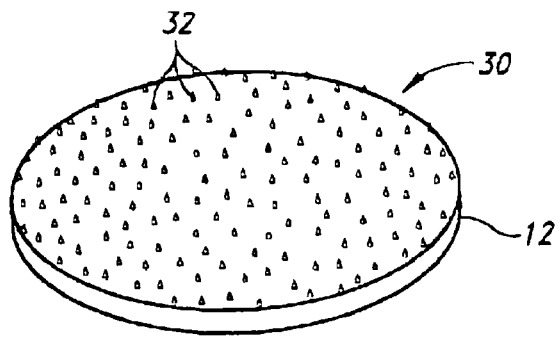
FIG. 7 is a isometric view of field emitter tips formed on the substrate after performance of an etching step.

In accordance with step 104 (FIG. 1), removal of the solvent from the suspension medium 20 occurs after the aggregation of colloidal particles 18 have been broken up. Removal of the solvent may occur through conventional evaporative steps, such as the application of heat to the composition. The removal of the solvent leaves behind a layer of colloidal particles 18 on the surface 16 of the substrate 12. As shown in FIG. 6, the photoresist fixes the position of each of the particles 18 relative to the surface 16 of the substrate 12. The colloidal particles 18 serve as a mask for the etching step 106 (FIG. 1). Etching may be performed in any known manner such as by chemical means, reactive plasma etching, or ion beam etching. For example, ion beam etching directs a beam of ions at the surface 16 of the substrate 10 through the mask of colloidal particles 18. The incident ion beam etches away the particles 18 and the surface 16. The relative etching rates of the particles 18 and the surface 16 determine the configuration of the etched surface 30, The etching may thereby form microelectronic devices) such as field emitter tips 32, in the surface 16 of the substrate 12.

Figure 8:
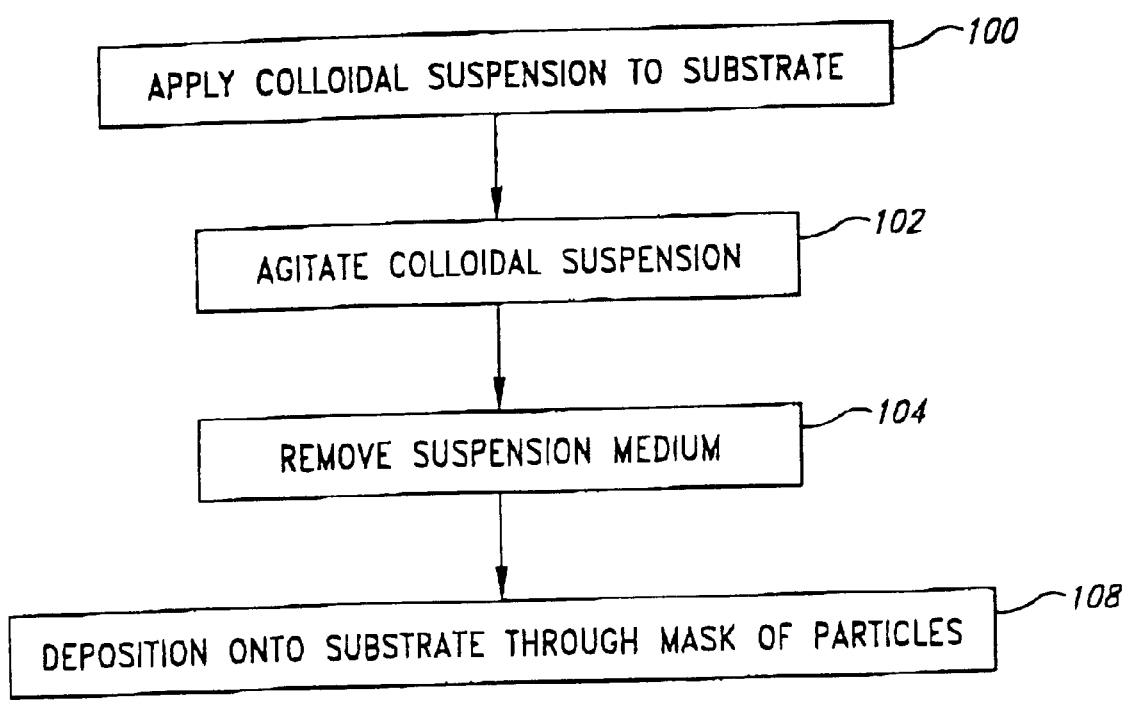
FIG. 8 is a flow chart of a second exemplary method of the invention.

A second exemplary method of carrying out the invention is shown in FIG. 8, wherein like numerals correspond to similar elements and steps carried out in the first exemplary method. In the second exemplary embodiment, the colloidal particles 18 left behind on the surface 16 after step 104 serve as a deposition mask. In step 108 material is deposited on the surface 16 of substrate 12 between the colloidal particles 18. Depositioning may be accomplished through conventional means, such as lift off, plating, and ion implanting.

Although specific embodiments of, and examples for, the present invention are described herein for illustrative purposes, various equivalent modifications can be made without departing from the spirit and scope of the invention, as will be recognized by those skilled in the relevant art. The teachings provided herein of the present invention can be applied to other substrates to define other microstructures, not necessarily the exemplary microelectronic devices, such as field emission emitter tips, generally described above.

These and other changes can be made to the invention in light of the above-detailed description. In general, in the following claims, the terms used should not be construed to limit the invention to the specific embodiments disclosed in the specification and claims, but should be construed to include all substrates and manufacturing of such substrates that operate in accordance with the claims. Accordingly, the invention is not limited by the disclosure, but instead its scope is to be determined entirely by the following claims.

What is claimed is:

1. A composition for forming a mask on a surface of a substrate, the composition comprising:

a suspension medium, the suspension medium including an amount of deionized water, an amount of solvent and an amount of resist; and a plurality of particles suspended in the suspension medium so that the composition has a starting ratio of approximately 1:5:20 of particles suspended in deionized water, to solvent, to resist.

2. The composition of claim 1, wherein the solvent is isopropyl alcohol.

3. The composition of claim 1, wherein there are approximately 1 cubic centimeter of particles to each liter of deionized water.

* * * * *